US012733380B2

(12) United States Patent
Liu et al.

(10) Patent No.: US 12,733,380 B2
(45) Date of Patent: Sep. 8, 2026

(54) DISPLAY SUBSTRATES AND MANUFACTURING METHODS THEREOF, DISPLAY PANELS AND DISPLAY APPARATUSES

(71) Applicant: BOE Technology Group Co., Ltd., Beijing (CN)

(72) Inventors: Wenqi Liu, Beijing (CN); Zhongyuan Sun, Beijing (CN); Che An, Beijing (CN); Jingkai Ni, Beijing (CN); Qingyu Huang, Beijing (CN); Jinxiang Xue, Beijing (CN); Guangcai Yuan, Beijing (CN); Chunyan Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 706 days.

(21) Appl. No.: 18/027,221

(22) PCT Filed: Jan. 14, 2022

(86) PCT No.: PCT/CN2022/072170
§ 371 (c)(1),
(2) Date: Mar. 20, 2023

(87) PCT Pub. No.: WO2023/133857
PCT Pub. Date: Jul. 20, 2023

(65) Prior Publication Data

US 2024/0315115 A1 Sep. 19, 2024

(51) Int. Cl.
*H10K 59/12* (2023.01)
*H10K 59/38* (2023.01)
(Continued)

(52) U.S. Cl.
CPC ..... *H10K 59/8731* (2023.02); *H10K 59/1201* (2023.02); *H10K 59/38* (2023.02); *H10K 2102/351* (2023.02)

(58) Field of Classification Search
CPC .. H10K 2102/351; H10K 50/80; H10K 59/00; H10K 59/1201; H10K 59/38; H10K 59/873; H10K 59/8731; H10K 59/8792
See application file for complete search history.

(56) References Cited

U.S. PATENT DOCUMENTS 10,424,748 B2 * 9/2019 Cai ...................... H10K 71/135
2011/0006327 A1 1/2011 Park et al.
(Continued)

FOREIGN PATENT DOCUMENTS

CN 206610830 U 11/2017
CN 109192878 A 1/2019
(Continued)

OTHER PUBLICATIONS

CN2022800000362 first office action dated Aug. 7, 2025.
PCT/CN2022/072170 international search report.
PCT/CN2022/072170 Written Opinion.

*Primary Examiner* — Jaehwan Oh
(74) *Attorney, Agent, or Firm* — IPro, PLLC

(57) ABSTRACT

A display substrate and its manufacturing method, a display panel and a display apparatus are provided. The display substrate includes a base (10), a light-emitting device layer (20) on the base (10), and an encapsulation structure (30) on a side of the light-emitting device layer (20) away from the base (10). A film layer farthest from the base (10) in the light-emitting device layer (20) is a light extraction layer (21). The encapsulation structure (30) includes a first inorganic encapsulation layer (31), an organic encapsulation layer (32) on a side of the first inorganic encapsulation layer (31) away from the base (10), and a second inorganic
(Continued)

encapsulation layer (33) on a side of the organic encapsulation layer (32) away from the base (10). The first inorganic encapsulation layer (31) includes sub-film layers in which the one closest to the light extraction layer (21) is a low-stress inorganic layer (301) with a stress less than that of the second inorganic encapsulation layer (33). The display panel includes the display substrate. The display apparatus includes the display panel.

20 Claims, 5 Drawing Sheets

(51) Int. Cl.
*H10K 59/80* (2023.01)
*H10K 102/00* (2023.01)

(56) References Cited

U.S. PATENT DOCUMENTS

2012/0241811 A1 9/2012 Kim et al.
2020/0052051 A1* 2/2020 Lee ...................... H10D 86/451
2020/0083481 A1* 3/2020 Liu .................... H10K 59/8731
2020/0350511 A1 11/2020 Guo
2021/0175468 A1* 6/2021 Lee ........................ H10K 59/40
2021/0234129 A1 7/2021 Zhang
2021/0336224 A1* 10/2021 Yun ........................ H10K 59/38
2021/0408476 A1* 12/2021 Choi ...................... H10K 59/38
2021/0408482 A1 12/2021 Wang et al.
2022/0285653 A1 9/2022 Tian et al.
2023/0180582 A1 6/2023 Pu et al.

FOREIGN PATENT DOCUMENTS

CN 109427997 A 3/2019
CN 109904344 A 6/2019
CN 110165074 A 8/2019
CN 111430432 A 7/2020
CN 111584602 A 8/2020
CN 112331798 A 2/2021
CN 112714967 A 4/2021
CN 112714969 A 4/2021
JP 2004281085 A 10/2004

* cited by examiner

DISPLAY SUBSTRATES AND MANUFACTURING METHODS THEREOF, DISPLAY PANELS AND DISPLAY APPARATUSES

CROSS-REFERENCE TO RELATED APPLICATIONS

This application is a national stage of international PCT Application No. PCT/CN2022/072170 filed on Jan. 14, 2022, the entire contents of which are incorporated herein by reference.

TECHNICAL FIELD

This application relates to the field of display technologies, and in particular, to a display substrate and its manufacturing method, a display panel and a display apparatus.

BACKGROUND

OLED (Organic Light-Emitting Diode) displays are widely used in fields of display, lighting, intelligent wear, etc. due to their advantages, such as self-illumination, low driving voltage, high luminous efficiency, short response time, high definition and contrast, wide use temperature range and flexible display. The existing OLED displays have a problem of shorter service life.

SUMMARY

In a first aspect of the examples of the present application, a display substrate is provided. The display substrate includes:

a base;

a light-emitting device layer located on the base, where a film layer farthest from the base in the light-emitting device layer is a light extraction layer;

an encapsulation structure located on a side of the light-emitting device layer away from the base, where the encapsulation structure includes a first inorganic encapsulation layer, an organic encapsulation layer located on a side of the first inorganic encapsulation layer away from the base, and a second inorganic encapsulation layer located on a side of the organic encapsulation layer away from the base; and the first inorganic encapsulation layer includes a plurality of sub-film layers, a sub-film layer closest to the light extraction layer is a low-stress inorganic layer, and a stress of the low-stress inorganic layer is less than a stress of the second inorganic encapsulation layer.

In an example, the low-stress inorganic layer closest to the light extraction layer is made of a material including silicon oxynitride.

In an example, the first inorganic encapsulation layer includes at least two low-stress inorganic layers, and respective distances between the at least two low-stress inorganic layers and the light extraction layer are less than respective distances between other sub-film layers except the at least two low-stress inorganic layers in the first inorganic encapsulation layer and the light extraction layer.

In an example, the at least two low-stress inorganic layers include two silicon oxynitride film layers, and a silicon nitride film layer located between the two silicon oxynitride film layers.

In an example, the plurality of sub-film layers include at least one low-stress inorganic layer, the first inorganic encapsulation layer further includes a first inorganic material layer located on a side of the at least one low-stress inorganic layer away from the base, and the first inorganic material layer is made of a material including a metal oxide.

In an example, the display substrate further includes a color filter layer, where the color filter layer includes a plurality of color-resists arranged at intervals, and black matrixes respectively located between adjacent color-resists; the color filter layer further functions as the organic encapsulation layer; and the first inorganic encapsulation layer further includes a second inorganic material layer located between the first inorganic material layer and the organic encapsulation layer.

In an example, the first inorganic encapsulation layer further includes a third inorganic material layer located between the first inorganic material layer and the low-stress inorganic layer, and a compactness of the third inorganic material layer is greater than a compactness of the low-stress inorganic layer.

In an example, the display substrate further includes a color filter layer, where the color filter layer includes a plurality of color-resists arranged at intervals, and black matrixes respectively located between adjacent color-resists; and the color filter layer further functions as the organic encapsulation layer.

In an example, in a direction away from the base, the first inorganic encapsulation layer includes a first low-stress inorganic layer, a second low-stress inorganic layer, a third low-stress inorganic layer, a third inorganic material layer, a first inorganic material layer and a second inorganic material layer that are stacked in sequence; the first low-stress inorganic layer and the third low-stress inorganic layer are made of silicon oxynitride; the second low-stress inorganic layer, the third inorganic material layer and the second inorganic material layer are made of silicon nitride; and the first inorganic material layer is made of a material including a metal oxide.

In an example, respective thicknesses of the first low-stress inorganic layer and the third low-stress inorganic layer are less than a thickness of the second low-stress inorganic layer, and respective thicknesses of the first inorganic material layer and the second inorganic material layer are less than a thickness of the third inorganic material layer.

In an example, the display substrate further includes a display region and a binding region located on at least one side of the display region, where the light-emitting device layer and the encapsulation structure are located in a region outside the binding region.

In a second aspect of the examples of the present application, a display panel is provided. The display panel includes the display substrate as described above.

In a third aspect of the examples of the present application, a display apparatus is provided. The display apparatus includes the display panel as described above.

In a fourth aspect of the examples of the present application, a method of manufacturing a display substrate is provided. The manufacturing method includes:

preparing a base;

forming a light-emitting device layer on the base, where a film layer farthest from the base in the light-emitting device layer is a light extraction layer;

on a side of the light-emitting device layer away from the base, forming a first inorganic encapsulation layer, an organic encapsulation layer located on a side of the first inorganic encapsulation layer away from the base, and a second inorganic encapsulation layer located on a side of the organic encapsulation layer away from the base in sequence, where the first inorganic encapsulation layer includes a plurality of sub-film layers, a sub-film layer closest to the light extraction layer is a low-stress inorganic layer, and a stress of the low-stress inorganic layer is less than a stress of the second inorganic encapsulation layer.

In an example, the display substrate includes a display region, and a binding region located on at least one side of the display region, and the light-emitting device layer is located in a region outside the binding region;

on the side of the light-emitting device layer away from the base, forming the first inorganic encapsulation layer, the organic encapsulation layer located on the side of the first inorganic encapsulation layer away from the base, and the second inorganic encapsulation layer located on the side of the organic encapsulation layer away from the base in sequence includes:

forming the first inorganic encapsulation layer located in the display region and the binding region on the base, and removing a portion of the first inorganic encapsulation layer located in the binding region by etching the first inorganic encapsulation layer;

forming a color filter layer located outside the binding region on the first inorganic encapsulation layer, where the color filter layer includes a plurality of color-resists arranged at intervals and black matrixes respectively located between adjacent color-resists, and the color filter layer further functions as the organic encapsulation layer;

forming the second inorganic encapsulation layer located in the display region and the binding region on the organic encapsulation layer, and removing a portion of the second inorganic encapsulation layer located in the binding region by etching the second inorganic encapsulation layer.

In an example, forming the first inorganic encapsulation layer includes;

forming at least one low-stress inorganic layer; and forming a first inorganic material layer on a side of the low-stress inorganic layer away from the base through Atomic Layer Deposition, where the first inorganic material layer is made of a material including a metal oxide.

For the display substrate and its manufacturing method, the display panel and the display apparatus in the examples of the present application, since the sub-film layer in the first inorganic encapsulation layer closest to the light extraction layer in the light-emitting device layer is the low-stress inorganic layer, and the stress of the low-stress inorganic layer is less than that of the second inorganic encapsulation layer, a stress difference between the light extraction layer and the low-stress inorganic layer closest to the light extraction layer in the first inorganic encapsulation layer is smaller. The pulling to the light extraction layer due to a larger stress difference between the light extraction layer and the sub-film layer closest to the light extraction layer in the first inorganic encapsulation layer can be prevented, so that the deformation of the light extraction layer caused by the pulling and thus affecting the service life of the light-emitting device layer can be prevented. Therefore, the service life of the display panel can be improved.

It should be understood that the above general description and the following detailed description are only exemplary and explanatory and are not restrictive of the present application.

BRIEF DESCRIPTION OF THE DRAWINGS

The accompanying drawings, which are incorporated in and constitute a part of this specification, illustrate examples consistent with the present application and, together with the description, serve to explain the principle of the application.

DETAILED DESCRIPTION OF THE EMBODIMENTS

Figure 1:
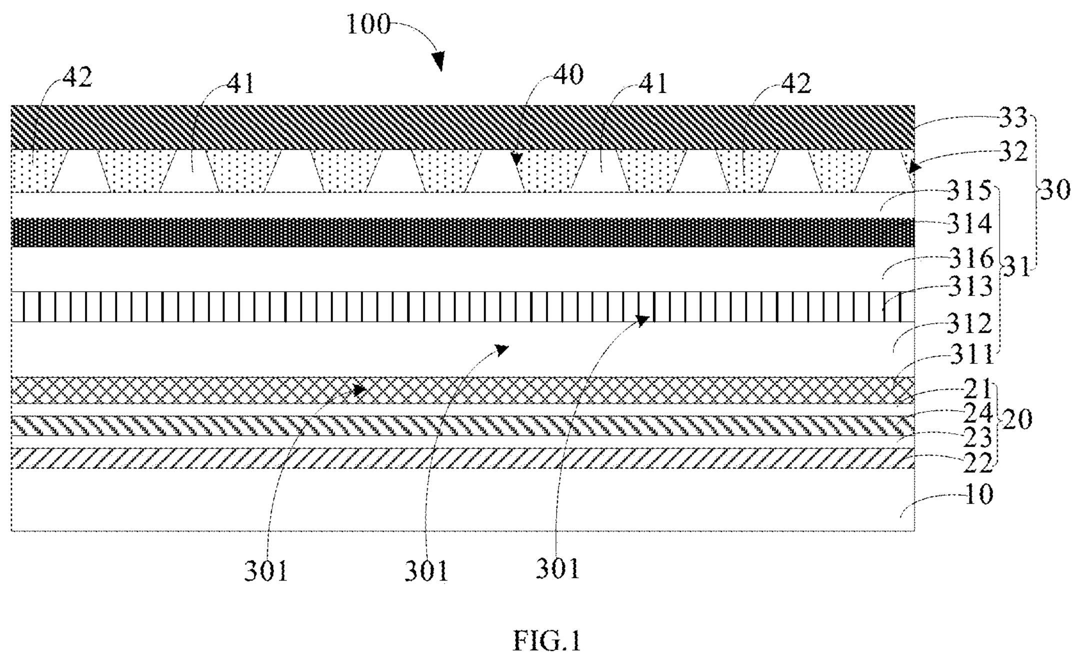
FIG. 1 is a partial sectional view illustrating a display substrate according to an example of the present application.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present application. Rather, they are merely examples of apparatuses and methods consistent with some aspects of the present application as detailed in the appended claims.

The terms used in the present application are for the purpose of describing particular examples only, and are not intended to limit the present application. Terms determined by “a”, “the” and “said” in their singular forms in the present application and the appended claims are also intended to include plurality, unless clearly indicated otherwise in the context.

It should be understood that “first”, “second” and similar words used in the specification and claims of the present application do not represent any order, quantity or importance, but are used only to distinguish different components. Likewise, similar words such as “one”, “a” or “an” do not represent a quantity limit, but represent that there is at least one. Unless otherwise indicated, similar words such as “front”, “rear”, “lower” and/or “upper” are only for convenience of description, and are not limited to one position or one spatial orientation. Similar words such as “including” or “comprising” mean that an element or an item appearing before “including” or “comprising” covers elements or items and their equivalents listed after “including” or “comprising”, without excluding other elements or items.

The display substrate and its manufacturing method, the display panel and the display apparatus in the examples of the present application will be described in detail below with reference to the accompanying drawings. The features in the examples and embodiments may be supplemented or combined with each other in a case of no conflict.

In an example of the present application, a display substrate is provided. Referring to FIG. 1, the display substrate includes a base 10, a light-emitting device layer 20 and an encapsulation structure 30.

The light-emitting device layer 20 is located on the base 10, and a film layer farthest from the base 10 in the light-emitting device layer 20 is a light extraction layer 21. The encapsulation structure 30 is located on a side of the light-emitting device layer 20 away from the base 10. The encapsulation structure 30 includes a first inorganic encapsulation layer 31, an organic encapsulation layer 32 located on a side of the first inorganic encapsulation layer 31 away from the base 10, and a second inorganic encapsulation layer 33 located on a side of the organic encapsulation layer 32 away from the base 10. The first inorganic encapsulation layer 31 includes a plurality of sub-film layers. A sub-film layer closest to the light extraction layer 21 is a low-stress inorganic layer 301, and a stress of the low-stress inorganic layer 301 is less than that of the second inorganic encapsulation layer 33.

For the display substrate in the examples of the present application, since the sub-film layer in the first inorganic encapsulation layer 31 closest to the light extraction layer 21 in the light-emitting device layer 20 is the low-stress inorganic layer 301, and the stress of the low-stress inorganic layer 301 is less than that of the second inorganic encapsulation layer 33, a stress difference between the light extraction layer 21 and the low-stress inorganic layer 301 closest to the light extraction layer 21 in the first inorganic encapsulation layer 31 is smaller. The pulling to the light extraction layer 21 due to a larger stress difference between the light extraction layer 21 and the sub-film layer closest to the light extraction layer 21 in the first inorganic encapsulation layer 31 can be prevented, so that the deformation of the light extraction layer 21 caused by the pulling and thus affecting the service life of the light-emitting device layer 20 can be prevented. Therefore, the service life of a display panel can be improved.

In an example, the base 10 may be a flexible base or a rigid base. The flexible base may made of one or more of polyimide, polyethylene terephthalate or polycarbonate. The rigid base may made of glass, silicon, etc.

In an example, the light-emitting device layer 20 further includes one or more first electrodes 22, a light-emitting material layer 23 located on a side of the first electrodes 22 away from the base 10, and one or more second electrodes 24 located on a side of the light-emitting material layer 23 away from the base 10. The light extraction layer 21 is located on a side of the second electrodes 24 away from the base 10. The first electrodes 22 may be anodes. The second electrodes 24 may be cathodes, or may be planar electrodes connected with each other. The light-emitting material layer 23 may be an organic light-emitting material laver.

In an example, the light-emitting device layer 20 includes a plurality of sub-pixels, and the first electrodes 22 of respective sub-pixels are arranged at intervals. The light-emitting device layer 20 may include sub-pixels with at least three different light-emitting colors. For example, the light-emitting device layer 20 includes one or more red sub-pixels, one or more green sub-pixels and one or more blue sub-pixels.

In an example, the display substrate 100 further includes a pixel defining layer, and the pixel defining layer is provided with a plurality of pixel openings. The pixel defining layer is located on a side of the first electrodes 22 away from the base 10, exposing at least a part of the first electrode 22. The light-emitting material layer 23 is at least partially located in the pixel openings. The second electrodes 24 cover the pixel defining layer and the pixel openings.

In an example, the low-stress inorganic layer 301 in the first inorganic encapsulation layer 31 closest to the light extraction layer 21 in the light-emitting device layer 20 is in direct contact with the light extraction layer 21. With such configuration, it is more conducive to reducing the stress difference between the light extraction layer 21 and the sub-film layer closest to the light extraction layer 21 in the first inorganic encapsulation layer 31, which can more effectively prevent the deformation caused by the pulling to the light extraction layer 21, and is more conducive to improving the service life of the display substrate.

In an example, the stress of the low-stress inorganic layer 301 is less than or equal to 100 MPa.

In an example, the low-stress inorganic layer 301 closest to the light extraction layer 21 can be made of a material including silicon oxynitride. When the low-stress inorganic layer 301 is made of the material including silicon oxynitride, the stress of the low-stress inorganic layer 301 may be smaller, and the stress difference between the low-stress inorganic layer 301 and the light extraction layer 21 is reduced more effectively. In addition, when the low-stress inorganic layer 301 is made of the material including silicon oxynitride, the adhesion of the low-stress inorganic layer 301 may be better, and the adhesion between the low-stress inorganic layer 301 and the light extraction layer 21 is improved, so as to avoid peeling therebetween. At the same time, a thermal expansion coefficient of the low-stress inorganic layer 301 may be smaller, and a thermal expansion coefficient difference between the low-stress inorganic layer 301 and the light extraction layer 21 is reduced. Therefore, the peeling between the light extraction layer 21 and the low-stress inorganic layer 301 due to a larger thermal expansion coefficient difference between them caused by a rising temperature of film layers during the manufacturing and working of the display substrate can be prevented, and the effect on pulling the light extraction layer 21 can also be reduced. In some examples, the light extraction layer 21 can be made of silicon oxynitride.

In an example, the first inorganic encapsulation layer 31 includes at least two low-stress inorganic layers 301, and respective distances between the at least two low-stress inorganic layers 301 and the light extraction layer 21 are less than respective distances between other sub-film layers except the at least two low-stress inorganic layers in the first inorganic encapsulation layer 31 and the light extraction layer 21. That is, the at least two low-stress inorganic layers 301 in the first inorganic encapsulation layer 31 are located on a side of the other sub-film layers (sub-film layers with a higher stress) closer to the light extraction layer 21. With such configuration, at least two sub-film layers closest to the light extraction layer 21 in the first inorganic encapsulation layer 31 are low-stress inorganic layers 301, which can further reduce the stress difference between the first inorganic encapsulation layer 31 and the light extraction layer 21 and the effect on pulling the light extraction layer 21, and improve the service life of the light extraction layer 21.

In an example, the at least two low-stress inorganic layers include two silicon oxynitride film layers, and a silicon nitride film layer located between the two silicon oxynitride film layers. That is, the at least two low-stress inorganic layers include three low-stress inorganic layers 301. In the example shown in FIG. 1, the at least two low-stress inorganic layers include a first low-stress inorganic layer 311, a second low-stress inorganic layer 312 located on a side of the first low-stress inorganic layer 311 away from the base 10, and a third low-stress inorganic layer 313 located on a side of the second low-stress inorganic layer 312 away from the base 10. The first low-stress inorganic layer 311 and the third low-stress inorganic layer 313 are silicon oxynitride film layers, and the second low-stress inorganic layer 312 is a silicon nitride film layer. In this way, the first low-stress inorganic layer 311 and the third low-stress inorganic layer 313 have smaller stress and thermal expansion coefficient and better adhesion. The second low-stress inorganic layer 312 has better compactness and better effect on blocking water and oxygen. The cooperation of the three film layers can make respective stress differences and respective thermal expansion coefficient differences between the three low-stress inorganic layers 301 in the first inorganic encapsulation layer 31 and the light extraction layer 21 smaller, while improving the adhesion between the first inorganic encapsulation layer 31 and the light extraction layer 21 and helping to improve the effect of the first inorganic encapsulation layer 31 on blocking water and oxygen. In some examples, the first low-stress inorganic layer 311 and the third low-stress inorganic layer 313 can be made of silicon oxynitride, and the second low-stress inorganic layer 312 can be made of silicon nitride.

In an example, the low-stress inorganic layers 301 in the first inorganic encapsulation layer 31 are manufactured through CVD (Chemical Vapor Deposition).

In an example, when the low-stress inorganic layers are made of a material including silicon oxynitride, the low-stress inorganic layers have smaller density, better looseness and lower refractive index than high-stress inorganic layers including silicon oxynitride, and an interaction force between atoms is gravitation. In addition, the content of oxygen atoms in the low-stress inorganic layers increases, and the content of nitrogen atoms in the low-stress inorganic layers decreases. During the manufacturing of the low-stress inorganic layers, the content of $N_2O$ increases, and the content of $NH_3$ decreases.

In some examples, when the low-stress inorganic layers are made of a material including silicon nitride, the low-stress inorganic layers have smaller density, better looseness and lower refractive index than high-stress inorganic layers including silicon nitride. In addition, the content of nitrogen atoms in the low-stress inorganic layers is less. During the manufacturing of the low-stress inorganic layers, $N_2$ and $H_2$ as carrier gas are exchanged, which increases the content of $N_2$ and decreases the content of $H_2$. This is because, during the manufacturing of the low-stress inorganic layers, $H_2$ can saturate dangling bonds in the film layers and enhance plasma characteristics. However, increasing the content of $N_2$ can reduce this effect. Therefore, the content of nitrogen atoms in the low-stress inorganic layers can be decreased.

In an example, the plurality of sub-film layers include at least one low-stress inorganic layer 301, and the first inorganic encapsulation layer 31 further includes a first inorganic material layer 314 located on a side of the at least one low-stress inorganic layer 301 away from the base 10. The first inorganic material layer 314 can be made of a material including a metal oxide. When the first inorganic material layer 314 is made of the material including a metal oxide, the first inorganic material layer 314 can be formed through ALD (Atomic Layer Deposition), so that the first inorganic material layer 314 has better compactness, which helps to improve the encapsulating effect of the display substrate. In some examples, the first inorganic material layer 314 can be made of a material including aluminium oxide. For example, the first inorganic material layer 314 is made of aluminum oxide.

In an example, the first inorganic material layer 314 includes at least one atomic film layer. When the plurality of sub-film layers in the first inorganic encapsulation layer 31 include a plurality of low-stress inorganic layers 301, the first inorganic material layer 314 is located on a side of the plurality of low-stress inorganic layers 301 away from the base 10, that is, the plurality of low-stress inorganic layers 301 are located on a side of the first inorganic material layer 314 toward the base 10. The atomic film layer has better compactness and good coverage for its lower film layer, which can reduce a gap between the atomic film layer and its lower film layer. Therefore, the first inorganic material layer 314 including the atomic film layer has better compactness and better effect on blocking water and oxygen, which helps to improve the encapsulating effect of the display substrate.

In an example, the first inorganic material layer 314 is formed through ALD. The oxide layer manufactured through ALD is an atomic-level film layer, so that the first inorganic encapsulation layer 31 includes the atomic film layer. The atomic-level film layer has higher coverage for pores in a surface of the lower film layer, which can reduce a gap between the atomic-level film layer and the lower film layer. In addition, the atomic-level film layer formed through ALD is deposited on the lower film layer by way of chemical adsorption, and the adhesion between the atomic-level film layer and the lower film layer is higher. Therefore, there is higher adhesion between the first inorganic material layer 314 and the lower sub-film layer, which helps to improve the encapsulating effect of the display substrate 100. In some examples, when the first inorganic material layer 314 is formed through ALD, the first inorganic material layer 314 may include a plurality of single-atom film layers.

In an example, the first inorganic encapsulation layer 31 further includes a second inorganic material layer 315 located between the first inorganic material layer 314 and the organic encapsulation layer 32. The second inorganic material layer 315 can prevent the first inorganic encapsulation layer 31 from being damaged during the etching of the organic encapsulation layer 32. The compactness of the second inorganic material layer 315 can be greater than that of the low-stress inorganic layer 301, so as to further improve the effect of the first inorganic encapsulation layer 31 on blocking water and oxygen. The second inorganic material layer 315 may be made of a material including silicon nitride. For example, the second inorganic material layer 315 is made of silicon nitride. The second inorganic material layer 315 can be manufactured through CVD.

In an example, the first inorganic encapsulation layer 31 further includes a third inorganic material layer 316 located between the first inorganic material layer 314 and the low-stress inorganic layer 301. The compactness of the third inorganic material layer 316 is greater than that of the low-stress inorganic layer 301. By configuring the third inorganic material layer 316 with larger compactness, the third inorganic material layer 316 covers pores in the low-stress inorganic layer 301 below it, which can prevent that the effect of the low-stress inorganic layer 301 on blocking water and oxygen is poor due to its poor compactness, and improve the performance of the first inorganic encapsulation layer 31 in blocking water and oxygen. In addition, both the third inorganic material layer 316 and the first inorganic material layer 314 can cover pores in the low-stress inorganic layer 301, and their cooperation can make the effect of the first inorganic encapsulation layer 31 on blocking water and oxygen better. The third inorganic material layer 316 can be manufactured through CVD. In the example shown in FIG. 1, the third inorganic material layer 316 is located between the first inorganic material layer 314 and the third low-stress inorganic layer 313.

In some examples, the third inorganic material layer 316 is made of a material including silicon nitride. The compactness of the silicon nitride material is better, which can make the compactness of the third inorganic material layer 316 higher. The third inorganic material layer 316 may be made of silicon nitride.

In an example, as shown in FIG. 1, in a direction away from the base 10, the first inorganic encapsulation layer 31 includes the first low-stress inorganic layer 311, the second low-stress inorganic layer 312, the third low-stress inorganic layer 313, the third inorganic material layer 316, the first inorganic material layer 314 and the second inorganic material layer 315 that are stacked in sequence. The first low-stress inorganic layer 311 and the third low-stress inorganic layer 313 are made of silicon oxynitride. The second low-stress inorganic layer 312, the third inorganic material layer 316 and the second inorganic material layer 315 are made of silicon nitride. The first inorganic material layer 314 is made of a material including a metal oxide. With such configuration, the number of sub-film layers in the first inorganic encapsulation layer 31 is larger, and during the spread of water and oxygen to the light-emitting device layer 20 through the first inorganic encapsulation layer 31, a path through which water and oxygen will pass is long, so that it is not easy for water and oxygen to intrude into the light-emitting device layer 20, which can improve the performance of the first inorganic encapsulation layer 31 in blocking water and oxygen. The first inorganic material layer 314 is made of a material including a metal oxide, and the first inorganic material layer 314 can be formed through ALD, that is, the first inorganic material layer 314 has better compactness, which can improve the performance of the first inorganic encapsulation layer in blocking water and oxygen. The first low-stress inorganic layer 311, the second low-stress inorganic layer 312 and the third low-stress inorganic layer 313 have a smaller distance from the light extraction layer 21, and the stress differences and the thermal expansion coefficient differences between the first low-stress inorganic layer 311, the second low-stress inorganic layer 312 and the third low-stress inorganic layer 313 and the light extraction layer 21 are smaller, which can reduce the force on pulling the light extraction layer 21, prevent the light extraction layer 21 from deforming, and improve the service life of the display substrate.

Further, respective thicknesses of the first low-stress inorganic layer 311 and the third low-stress inorganic layer 313 are less than a thickness of the second low-stress inorganic layer 312, and respective thicknesses of the first inorganic material layer 314 and the second inorganic material layer 315 are less than a thickness of the third inorganic material layer 316. With such configuration, the encapsulating effect of the first inorganic encapsulation layer 31 can be ensured on the premise of effectively reducing the effect on pulling the light extraction layer 21.

Further, the respective thicknesses of the first low-stress inorganic layer 311 and the third low-stress inorganic layer 313 are in the range of 0.05 μm~0.1 μm; the thickness of the second low-stress inorganic layer 312 is in the range of 0.3 μm~0.5 μm; the thickness of the third inorganic material layer 316 is in the range of 0.3 μm~0.5 μm; the thickness of the first inorganic material layer 314 is in the range of 0.05 μm~0.1 μm; the thickness of the second inorganic material layer 315 is in the range of 0.1 μm~0.2 μm. Through experiments and simulation verification, when the thickness of each film layer is set to be in its above thickness range, the effect on pulling the light extraction layer 21 can be effectively reduced and the encapsulating effect of the first inorganic encapsulation layer 31 can be ensured on the premise of avoiding too large thickness of the display substrate.

In some examples, the respective thicknesses of the first low-stress inorganic layer 311 and the third low-stress inorganic layer 313 are 0.05 μm, 0.07 μm, 0.09 μm, 0.1 μm, etc.; the thickness of the second low-stress inorganic layer 312 is 0.3 μm, 0.35 μm, 0.4 μm, 0.45 μm, 0.5 μm, etc.; the thickness of the first inorganic material layer 314 is 0.05 μm, 0.07 μm, 0.09 μm, 0.1 μm, etc.; the thickness of the second inorganic material layer 315 is 0.1 μm, 0.12 μm, 0.15 μm, 0.17 μm, 0.2 μm, etc.; the thickness of the third inorganic material layer 316 is 0.3 μm, 0.35 μm, 0.4 μm, 0.45 μm, 0.5 μm, etc.

Figure 2:
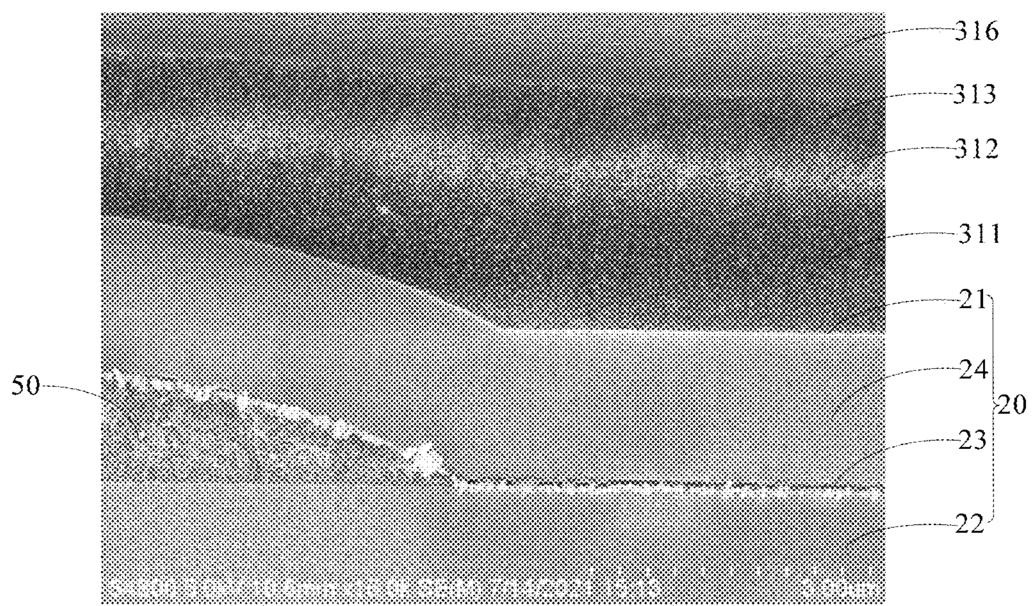
FIG. 2 is a partial scanning electron microscope image illustrating a display substrate in a sectioning state according to an example of the present application.

FIG. 2 is a partial scanning electron microscope image illustrating a display substrate in a sectioning state according to an example of the present application. As shown in FIG. 2, a pixel defining layer 50 is located on a first electrode 22; a light-emitting material layer 23 is located partially on the first electrode 22 and partially on a side wall of the pixel defining layer 50; a second electrode 24 covers the light-emitting material layer 23; a light extraction layer 21 is located on the first electrode 22, and a thickness of the light extraction layer 21 is smaller; a thickness of a first low-stress inorganic layer 311 is roughly equal to that of a third low-stress inorganic layer 313, and a third inorganic material layer 316 is in direct contact with the third low-stress inorganic layer 313.

In an example, the display substrate 100 further includes a color filter layer 40. The color filter layer 40 includes a plurality of color-resists 41 arranged at intervals and black matrixes 42 respectively located between adjacent color-resists 41. The color filter layer 40 further functions as an organic encapsulation layer 32. The color filter layer 40 can realize the color display of the display substrate, and filter light emitted from the light-emitting device layer 20 to avoid stray light emission, which can improve the display effect of the display substrate 100. In addition, the color filter layer 40 can reduce the amount of reflected light after external light is incident on the display substrate, which can improve the user experience. The color filter layer 40 further functions as the organic encapsulation layer of an encapsulation structure 30, which can simplify the film layer structure of the display substrate, and help to reduce the thickness of the display substrate and improve the light exitance of the display substrate. The color filter layer 40 has good film forming property and surface flatness, which helps to improve the film layer flatness of the encapsulation structure 30. The color filter layer 40 can clad particles of the inorganic layers below it, which can make the film layer uniformity of a second inorganic encapsulation layer 33 better, and help to improve the encapsulating performance of the encapsulation structure.

In an example, the color-resists 41 in the color filter layer 40 correspond to sub-pixels one by one, and orthographic projections of the color-resists 41 onto a base 10 cover that of corresponding sub-pixels onto the base 10. Light-emitting colors of the sub-pixels are the same as colors of corresponding color-resists 41. When the light-emitting device layer 20 includes red sub-pixels, green sub-pixels and blue sub-pixels, the color filter layer 40 includes red color-resists, green color-resists and blue color-resists.

During the manufacturing of the color filter layer 40, color-resists 41 with the same color can be formed at the same time in the same process step. Specifically, a color-resist material can be coated firstly on a whole surface of the inorganic layer, and then the color-resist material can be patterned to obtain a plurality of color-resists 41 with the same color. The color-resist material can be patterned through exposure and development. A second inorganic material layer 315 between the color filter layer 40 and a first inorganic material layer 314 can prevent a developer from corroding the first inorganic material layer 314 during the development of the color-resists, so as to protect the first inorganic material layer 314, which helps to improve the performance of the first inorganic material layer in blocking water and oxygen.

In an example, a thickness of the color filter layer 40 is in the range of 2.5 μm~3.5 μm. With such configuration, it can be avoided not only that a smaller thickness of the color filter layer 40 causes a poor effect on cladding particles of the inorganic layers below it, but also that a larger thickness of the color filter layer 40 causes an increased thickness of the display substrate so as not to facilitate the thinning of the display substrate. In some examples, the thickness of the color filter layer 40 is 2.5 μm, 2.8 μm, 3.0 μm, 3.2 μm, 3.5 μm, etc.

In an example, the second inorganic encapsulation layer 33 is made of a material including silicon nitride. With such configuration, the second inorganic encapsulation layer 33 has better compactness and better effect on blocking water and oxygen. The second inorganic encapsulation layer 33 may be made of silicon nitride.

In an example, a thickness of the second inorganic encapsulation layer 33 is in the range of 0.6 μm~0.8 μm. With such configuration, it can be avoided not only that a smaller thickness of the second inorganic encapsulation layer 33 causes a poor effect on blocking water and oxygen, but also that a larger thickness of the second inorganic encapsulation layer 33 causes an increased thickness of the display substrate 100. In some examples, the thickness of the second inorganic encapsulation layer 33 is 0.6 μm, 0.65 μm, 0.7 μm, 0.75 μm, 0.8 μm, etc.

In an example, the display substrate further includes a driving circuit layer located between the base 10 and the light-emitting device layer 20. The driving circuit layer includes pixel driving circuits located outside a binding region (mainly in a display region), and binding terminals located in the binding region. The pixel driving circuits in the driving circuit layer can correspond to the sub-pixels in the light-emitting device layer 20 one to one, and each pixel driving circuit is configured to drive a corresponding sub-pixel.

Figures 3, 4:
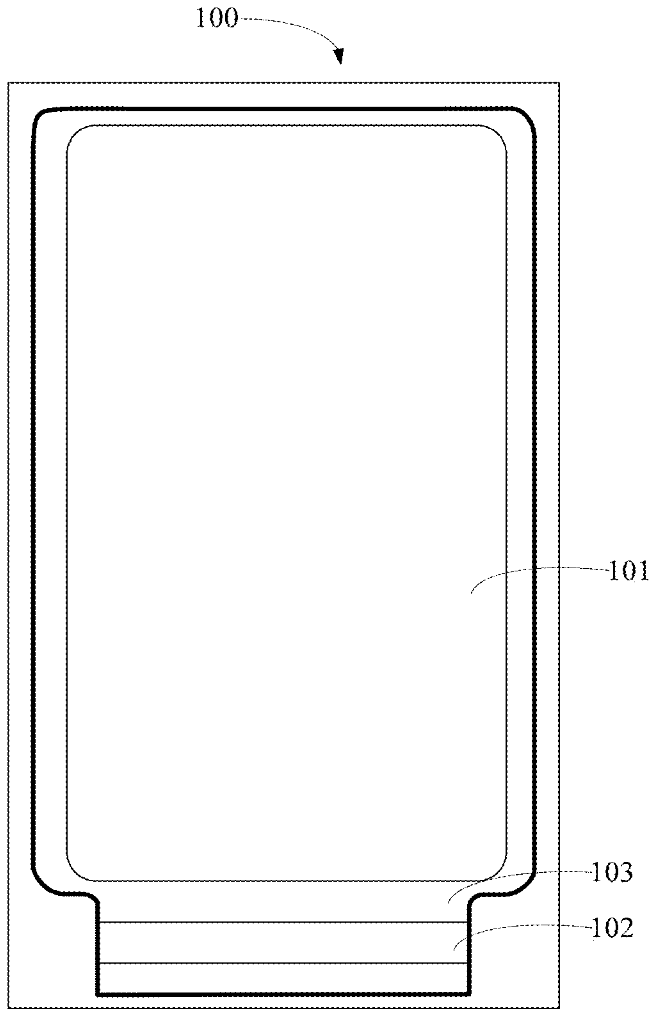
FIG. 3 is a top view illustrating a display substrate according to an example of the present application.
FIG. 4 is a partial sectional view illustrating a display substrate according to an example of the present application.

In an example, as shown in FIGS. 3 and 4, the display substrate 100 includes a display region 101, and a binding region 102 located on at least one side of the display region 101. The light-emitting device layer 20 and the encapsulation structure 30 are located in a region outside the binding region 102. The light-emitting device layer 20 and the encapsulation structure 30 are not formed in the binding region 102, so that the binding terminals in the binding region 102 are exposed, and can be configured to be bound with a driver chip or a flexible circuit board. In the examples shown in FIGS. 3 and 4, the binding region 102 is located on a side of the display region 101. Specifically, the binding region 102 may be located on a lower side of the display region 101. The light-emitting device layer 20 may be located only in the display region 101.

In an example, the display substrate 100 further includes a fanout region 103. The fanout region 103 is located between the display region 101 and the binding region 102. The encapsulation structure 30 can cover the display region 101 and the fanout region 103.

Figure 5:
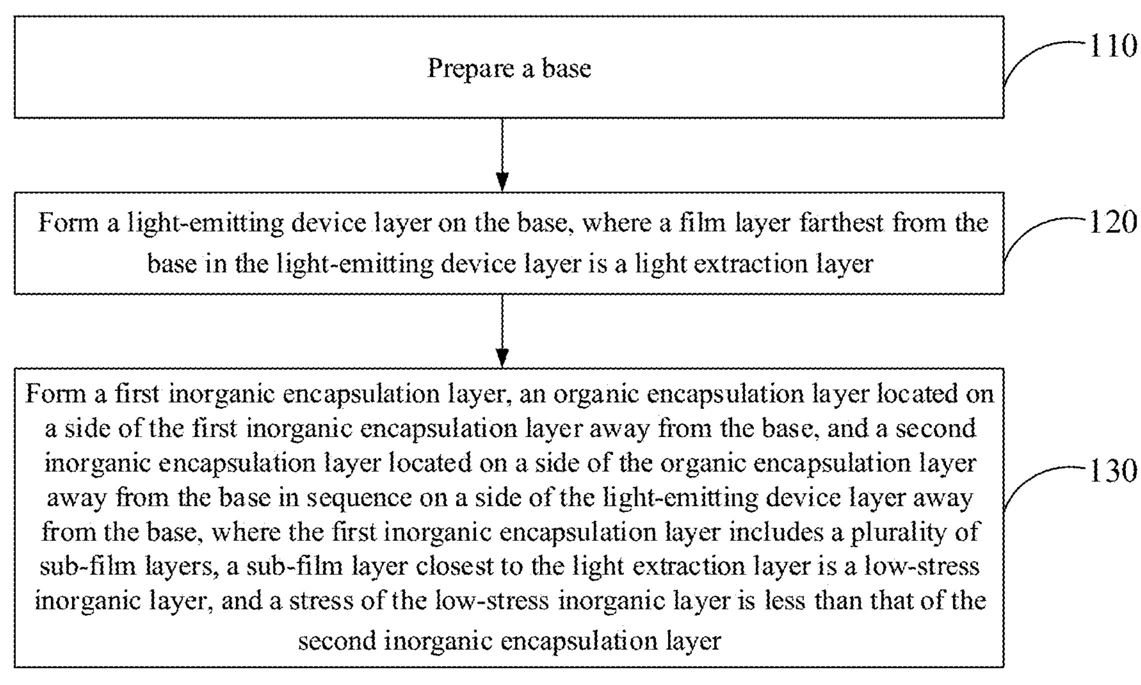
FIG. 5 is a flowchart illustrating a method of manufacturing a display substrate according to an example of the present application.

In an example of the present application, a method of manufacturing a display substrate is provided. As shown in FIG. 5, the method of manufacturing the display substrate includes the following steps 110 to 130.

At step 110, a base is prepared.

At step 120, a light-emitting device layer is formed on the base, where a film layer farthest from the base in the light-emitting device layer is a light extraction layer.

Figure 6:
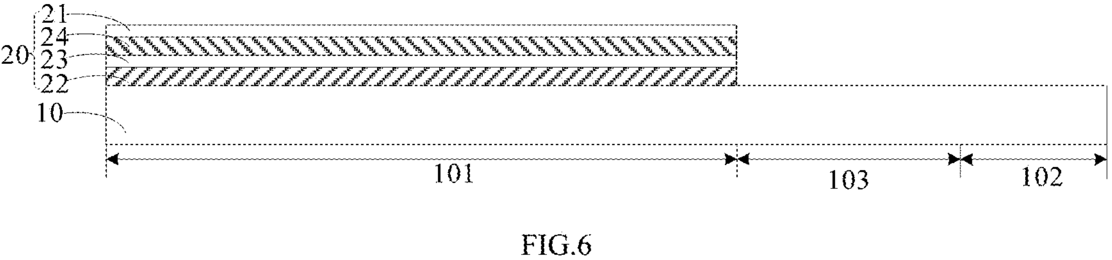
FIG. 6 is a partial sectional view illustrating a first intermediate structure of a display substrate according to an example of the present application.

A first intermediate structure shown in FIG. 6 can be obtained through the step 120. As shown in FIG. 6, the display substrate 100 includes a display region 101 and a binding region 102 located on at least one side of the display region 101. The display substrate 100 further includes a fanout region 103 located between the display region 101 and the binding region 102. The light-emitting device layer 20 is located only in the display region 101.

The light-emitting device layer 20 further includes one or more first electrodes 22, a light-emitting material layer 23 located on a side of the first electrodes 22 away from the base 10, and one or more second electrodes 24 located on a side of the light-emitting material layer 23 away from the base 10. The light extraction layer 21 is located on a side of the second electrodes 24 away from the base 10. The light-emitting device layer 20 is located in a region outside the binding region 102. The light-emitting device layer 20 may be located only in the display region 101.

At step 130, a first inorganic encapsulation layer, an organic encapsulation layer located on a side of the first inorganic encapsulation layer away from the base, and a second inorganic encapsulation layer located on a side of the organic encapsulation layer away from the base are formed in sequence on a side of the light-emitting device layer away from the base, where the first inorganic encapsulation layer includes a plurality of sub-film layers, a sub-film layer closest to the light extraction layer is a low-stress inorganic layer, and a stress of the low-stress inorganic layer is less than that of the second inorganic encapsulation layer.

In an example, the step 130 of forming the first inorganic encapsulation layer, the organic encapsulation layer located on the side of the first inorganic encapsulation layer away from the base, and the second inorganic encapsulation layer located on the side of the organic encapsulation layer away from the base in sequence on the side of the light-emitting device layer away from the base may include the following process.

Firstly, the first inorganic encapsulation layer located in the display region and the binding region is formed on the base, and the first inorganic encapsulation layer is etched to remove a portion of the first inorganic encapsulation layer located in the binding region.

Figure 7:
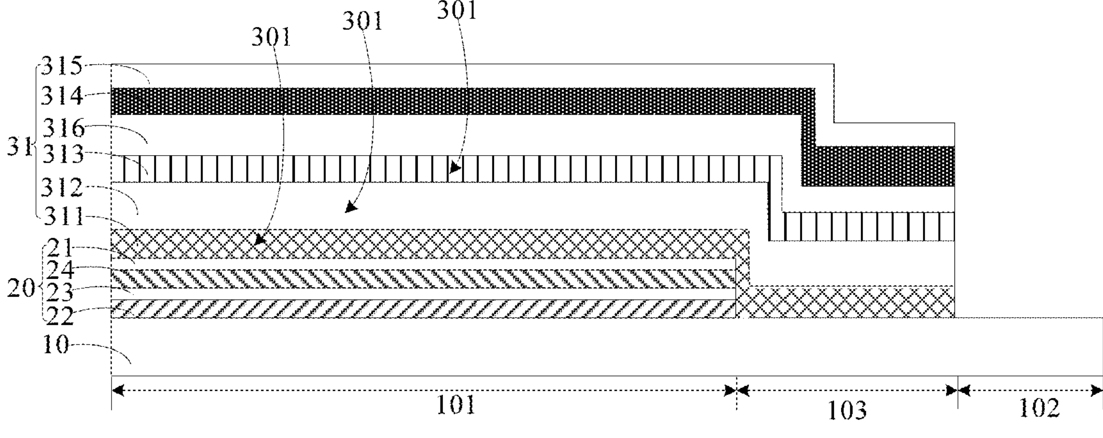
FIG. 7 is a partial sectional view illustrating a second intermediate structure of a display substrate according to an example of the present application.

A second intermediate structure shown in FIG. 7 can be obtained through this step. As shown in FIG. 7, the first inorganic encapsulation layer 31 does not cover the binding region 102, but can cover the display region 101 and the fanout region 103. In this step, the portion of the first inorganic encapsulation layer 31 located in the binding region 102 can be removed through wet etching.

Then, a color filter layer located outside the binding region is formed on the first inorganic encapsulation layer, and the color filter layer includes a plurality of color-resists arranged at intervals and black matrixes respectively located between adjacent color-resists; the color filter layer further functions as the organic encapsulation layer.

Figure 8:
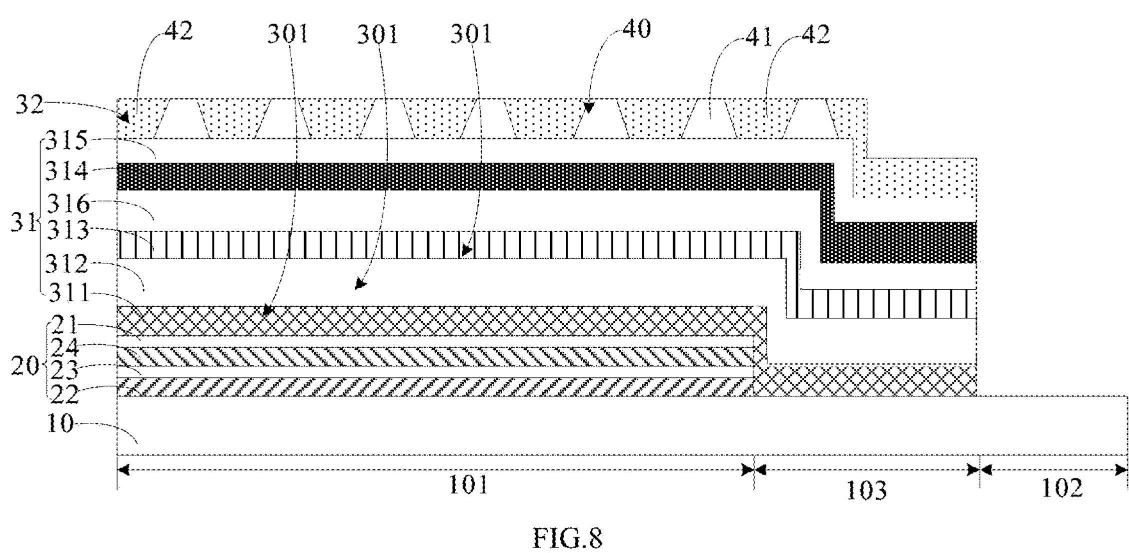
FIG. 8 is a partial sectional view illustrating a third intermediate structure of a display substrate according to an example of the present application.

A third intermediate structure shown in FIG. 8 can be obtained through this step. As shown in FIG. 8, the color filter layer 40 does not cover the binding region 102, but covers the display region 101 and the fanout region 103.

In an example, the color filter layer 40 includes color-resists 41 with at least three different colors and black matrixes 42 respectively located between adjacent color-resists 41. When the color filter layer 40 is formed, color-resists 41 with the same color are formed in the same process step, and color-resists 41 with different colors are formed in different process steps. The black matrixes may be formed firstly, and then the color-resists 41 are formed; or the color-resists 41 may be formed firstly, and then the black matrixes 42 are formed. When the color-resists with the same color are formed, a color-resist material can be coated firstly on a whole surface of a inorganic layer, and then the color-resist material can be patterned through exposure and development to obtain a plurality of color-resists 41 arranged at intervals and with the same color.

Next, the second inorganic encapsulation layer located in the display region and the binding region is formed on the organic encapsulation layer, and the second inorganic encapsulation layer is etched to remove a portion of the second inorganic encapsulation layer located in the binding region.

The display substrate shown in FIG. 4 can be obtained through this step. As shown in FIG. 4, the second inorganic encapsulation layer 33 is located in a region outside the binding region 102. Specifically, the second inorganic encapsulation layer 33 can cover the display region 101 and the fanout region 103. In this step, the portion of the second inorganic encapsulation layer 33 located in the binding region 102 can be removed through wet etching.

During the manufacturing of the display substrate 100 in the examples of the present application, since the organic encapsulation layer 32 in the encapsulation structure 30 is the color filter layer, the color filter layer is patterned through exposure and development, and the first inorganic encapsulation layer and the second inorganic encapsulation layer can be patterned through wet etching. During the patterning process of the film layers, a portion of each film layer located in the binding region can be removed, which will not cause peeling between adjacent film layers.

In an example, the step of forming the first inorganic encapsulation layer includes the following process.

Firstly, at least one low-stress inorganic layer is formed.

Then, a first inorganic material layer is formed on a side of the low-stress inorganic layer away from the base through ALD, and the first inorganic material layer is made of a material including a metal oxide.

The oxide layer manufactured through ALD is an atomic-level film layer, so that the first inorganic encapsulation layer 31 includes an atomic film layer. The atomic-level film layer has higher coverage for pores in a surface of its lower film layer, which can reduce a gap between the atomic-level film layer and the lower film layer. In addition, the atomic-level film layer formed through ALD is deposited on the lower film layer by way of chemical adsorption, and the adhesion between the atomic-level film layer and the lower film layer is higher. Therefore, there is higher adhesion between the first inorganic material layer 314 and the lower sub-film layer, which helps to improve the encapsulating effect of the display substrate 100. The first inorganic material layer may be made of a material including aluminium oxide.

In an example, as shown in FIG. 7, the step of forming the first inorganic encapsulation layer includes the following process: a first low-stress inorganic layer 311, a second low-stress inorganic layer 312, a third low-stress inorganic layer 313, a third inorganic material layer 316, the first inorganic material layer 314 and a second inorganic material layer 315 are formed in sequence on the base 10. The first low-stress inorganic layer 311 and the third low-stress inorganic layer 313 are made of silicon oxynitride. The second low-stress inorganic layer 312, the third inorganic material layer 316 and the second inorganic material layer 315 are made of silicon nitride. The first inorganic material layer 314 is made of a material including at least metal oxides.

Figure 9:
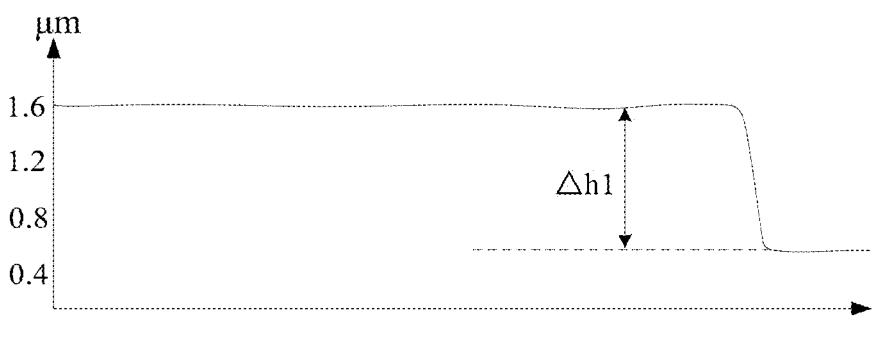
FIGS. 9 and 10 illustrate curves obtained by detecting respective heights of a portion of a second intermediate structure located in a display region and a portion of the second intermediate structure located in a binding region through AFM.
Figure 10:
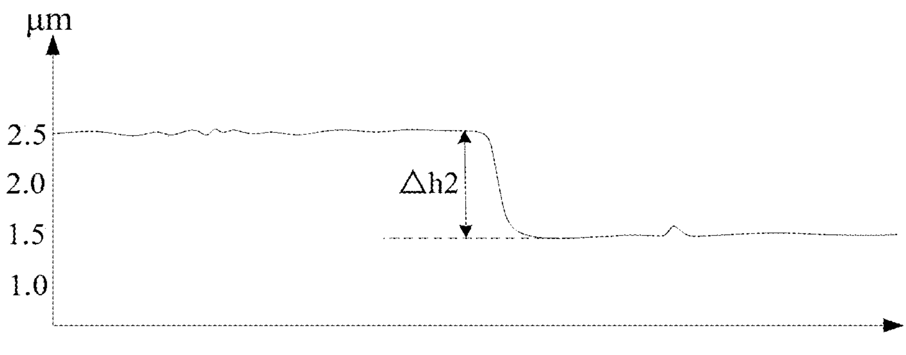

The second intermediate structure manufactured according to the manufacturing method in the examples of the present application is detected through energy spectrometer, and no nitrogen atom is detected in the binding region 102, indicating that the portion of the first inorganic encapsulation layer located in the binding region 102 is more thoroughly etched. Respective heights of a portion of the second intermediate structure located in the display region and a portion of the second intermediate structure located in the binding region are detected through AFM (Atomic Force Microscope) to obtain the curves shown in FIGS. 9 and 10. A thickness of the first inorganic encapsulation layer is about 1.0 μm. In FIG. 9, a portion with a larger height value represents a height of the display region portion, and a portion with a smaller height value represents a height of a central region of the binding region, where Δh1 is a height difference between the display region portion and the central region of the binding region, and the value of Δh1 is 1.01 μm. In FIG. 10, a portion with a larger height value represents a height of the display region portion, and a portion with a smaller height value represents a height of an edge region of the binding region, where Δh2 is a height difference between the display region portion and the edge region of the binding region, and the value of Δh2 is 1.0 μm. Ordinate values in FIGS. 9 and 10 represent only relative heights of film layers. It can be known from FIGS. 9 and 10 that portions of the first inorganic encapsulation layer located in both the central region and the edge region of the binding region are etched. It is indicated that, in the display substrate manufactured according to the method of manufacturing a display substrate in the examples of the present application, the portion of the first inorganic encapsulation layer located in the binding region is more thoroughly removed, without affecting the binding of the binding region.

In a technique of manufacturing the display substrate, the light-emitting device layer and the encapsulation structure located in the binding region are removed through photoresist expansion. Specifically, its manufacturing process includes: firstly forming a photoresist on the base, then forming the light-emitting device layer and the encapsulation structure on the photoresist in sequence, and subjecting the photoresist in the binding region to heating expansion through laser ablation to burst film layers (including the light-emitting device layer and the encapsulation structure) above the photoresist. In this technique, during the manufacturing of the light-emitting device layer and the encapsulation structure, high-temperature and plasma processes may damage the photoresist, causing occurrence of particles and film layer peeling on the film layers of the light-emitting device layer and the encapsulation structure formed above the photoresist, which will affect the product yield of the manufactured display substrate. During the manufacturing of the display substrate in the examples of the present application, there is no need to ablate the photoresist, which can avoid the low yield of the display substrate due to the polarity ablation of the photoresist and help to improve the yield of the display substrate.

One hundred display substrates manufactured according to the manufacturing method in the examples of the present application and one hundred display substrates manufactured through photoresist expansion were tested at the test temperature of 85° C. and the humidity of 85% for a duration of 240 h. After the test, nine of the display substrates manufactured according to the manufacturing method in the examples of the present application have black spots or poor edge display in their display regions and the yield of the display substrates is 91%, while the yield of the display substrates manufactured through photoresist expansion is less than 50%, indicating that the manufacturing method in the examples of the present application can effectively improve the yield of the display substrates.

The display substrate and its manufacturing method in the examples of the present application belong to the same inventive concept, and for description of relevant details and beneficial effects, reference may be made mutually, which will not be repeated here.

Figure 11:
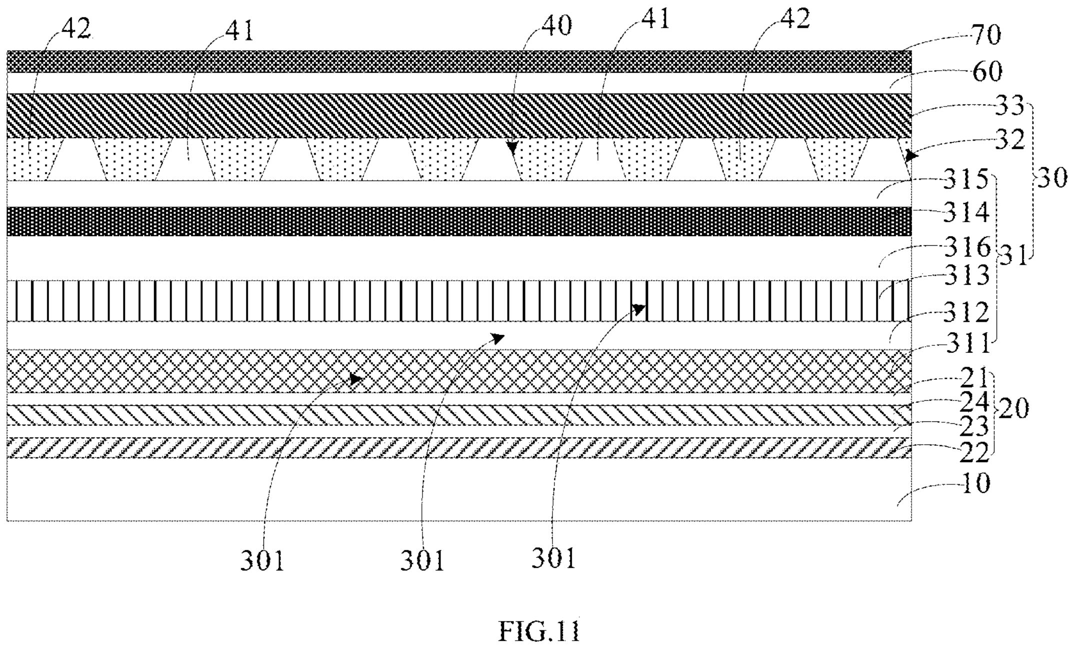
FIG. 11 is a partial sectional view illustrating a display panel according to an example of the present application.

In an example of the present application, a display panel is provided. The display panel includes the display substrate according to any one of the above examples. As shown in FIG. 11, the display panel further includes a cover plate 70 located on a side of the display substrate away from a base 10. The cover plate 70 can protect the display substrate. The cover plate 70 may be a glass cover plate.

In an example, the display panel further includes an adhesive layer 60 located between the cover plate 70 and the display substrate. The cover plate 70 is adhered on the display substrate through the adhesive layer 60. The adhesive layer 60 may be a transparent optical resin.

In an example of the present application, a display apparatus is provided. The display apparatus includes the display panel as described above.

In an example, the display apparatus further includes a shell, and the display panel is provided in the shell.

The display apparatus in the examples of the present application can be any device with a display function, such as a mobile phone, a tablet computer, a television, a notebook computer or a vehicle-mounted device.

The above are only preferred examples of the present application, which are not intended to make any formal limitation on the application. Although the present application has been disclosed as above in the preferred examples, these preferred examples are not used to limit the present application, and any person skilled in the art, without departing from the scope of the technical solutions of the present application, can make some changes or modifications to the technical contents disclosed above as equivalent examples with equivalent changes. However, without departing from the contents of the technical solutions of the present application, any simple revisions, equivalent changes and modifications made to the above examples based on the technical essence of the present application still fall within the scope of the technical solutions of the present application.

The contents disclosed in this patent document contain copyrighted material. Its copyright is owned by copyrighter. The copyrighter does not object to anyone copying the patent document or disclosure in official records and archives of the Patent and Trademark Office.

The invention claimed is:

1. A display substrate, comprising:

a base;

a light-emitting device layer located on the base, wherein a film layer farthest from the base in the light-emitting device layer is a light extraction layer;

an encapsulation structure located on a side of the light-emitting device layer away from the base, wherein the encapsulation structure comprises a first inorganic encapsulation layer, an organic encapsulation layer located on a side of the first inorganic encapsulation layer away from the base, and a second inorganic encapsulation layer located on a side of the organic encapsulation layer away from the base; and the first inorganic encapsulation layer comprises a plurality of sub-film layers, a sub-film layer closest to the light extraction layer is a low-stress inorganic layer, and a stress of the low-stress inorganic layer is less than a stress of the second inorganic encapsulation layer.

2. The display substrate according to claim 1, wherein the low-stress inorganic layer closest to the light extraction layer is made of a material comprising silicon oxynitride.

3. The display substrate according to claim 1, wherein, the first inorganic encapsulation layer comprises at least two low-stress inorganic layers, and respective distances between the at least two low-stress inorganic layers and the light extraction layer are less than respective distances between other sub-film layers except the at least two low-stress inorganic layers in the first inorganic encapsulation layer and the light extraction layer.

4. The display substrate according to claim 3, wherein the at least two low-stress inorganic layers comprise:

two silicon oxynitride film layers, and a silicon nitride film layer located between the two silicon oxynitride film layers.

5. The display substrate according to claim 1, wherein, the plurality of sub-film layers comprise at least one low-stress inorganic layer, the first inorganic encapsulation layer further comprises a first inorganic material layer located on a side of the at least one low-stress inorganic layer away from the base, and the first inorganic material layer is made of a material comprising a metal oxide.

6. The display substrate according to claim 5, further comprising a color filter layer, wherein the color filter layer comprises a plurality of color-resists arranged at intervals, and black matrixes respectively located between adjacent color-resists;

the color filter layer further functions as the organic encapsulation layer; and the first inorganic encapsulation layer further comprises a second inorganic material layer located between the first inorganic material layer and the organic encapsulation layer.

7. The display substrate according to claim 5, wherein, the first inorganic encapsulation layer further comprises a third inorganic material layer located between the first inorganic material layer and the low-stress inorganic layer, and a compactness of the third inorganic material layer is greater than a compactness of the low-stress inorganic layer.

8. The display substrate according to claim 1, further comprising a color filter layer, wherein the color filter layer comprises a plurality of color-resists arranged at intervals, and black matrixes respectively located between adjacent color-resists; and the color filter layer further functions as the organic encapsulation layer.

9. The display substrate according to claim 1, wherein, in a direction away from the base, the first inorganic encapsulation layer comprises a first low-stress inorganic layer, a second low-stress inorganic layer, a third low-stress inorganic layer, a third inorganic material layer, a first inorganic material layer and a second inorganic material layer that are stacked in sequence;

the first low-stress inorganic layer and the third low-stress inorganic layer are made of silicon oxynitride;

the second low-stress inorganic layer, the third inorganic material layer and the second inorganic material layer are made of silicon nitride; and the first inorganic material layer is made of a material comprising a metal oxide.

10. The display substrate according to claim 9, wherein, respective thicknesses of the first low-stress inorganic layer and the third low-stress inorganic layer are less than a thickness of the second low-stress inorganic layer, and respective thicknesses of the first inorganic material layer and the second inorganic material layer are less than a thickness of the third inorganic material layer.

11. The display substrate according to claim 1, further comprising a display region and a binding region located on at least one side of the display region, wherein the light-emitting device layer and the encapsulation structure are located in a region outside the binding region.

12. A display panel, comprising a display substrate comprising:

a base;

a light-emitting device layer located on the base, wherein a film layer farthest from the base in the light-emitting device layer is a light extraction layer;

an encapsulation structure located on a side of the light-emitting device layer away from the base, wherein the encapsulation structure comprises a first inorganic encapsulation layer, an organic encapsulation layer located on a side of the first inorganic encapsulation layer away from the base, and a second inorganic encapsulation layer located on a side of the organic encapsulation layer away from the base; and the first inorganic encapsulation layer comprises a plurality of sub-film layers, a sub-film layer closest to the light extraction layer is a low-stress inorganic layer, and a stress of the low-stress inorganic layer is less than a stress of the second inorganic encapsulation layer.

13. A display apparatus, comprising the display panel according to claim 12.

14. A method of manufacturing a display substrate, comprising:

preparing a base;

forming a light-emitting device layer on the base, wherein a film layer farthest from the base in the light-emitting device layer is a light extraction layer;

on a side of the light-emitting device layer away from the base, forming a first inorganic encapsulation layer, an organic encapsulation layer located on a side of the first inorganic encapsulation layer away from the base, and a second inorganic encapsulation layer located on a side of the organic encapsulation layer away from the base in sequence, wherein the first inorganic encapsulation layer comprises a plurality of sub-film layers, a sub-film layer closest to the light extraction layer is a low-stress inorganic layer, and a stress of the low-stress inorganic layer is less than a stress of the second inorganic encapsulation layer.

15. The method of manufacturing a display substrate according to claim 14, wherein the display substrate comprises a display region, and a binding region located on at least one side of the display region, and the light-emitting device layer is located in a region outside the binding region;

on the side of the light-emitting device layer away from the base, forming the first inorganic encapsulation layer, the organic encapsulation layer located on the side of the first inorganic encapsulation layer away from the base, and the second inorganic encapsulation layer located on the side of the organic encapsulation layer away from the base in sequence comprises:

forming the first inorganic encapsulation layer located in the display region and the binding region on the base, removing a portion of the first inorganic encapsulation layer located in the binding region by etching the first inorganic encapsulation layer;

forming a color filter layer located outside the binding region on the first inorganic encapsulation layer, wherein the color filter layer comprises a plurality of color-resists arranged at intervals and black matrixes respectively located between adjacent color-resists, and the color filter layer further functions as the organic encapsulation layer;

forming the second inorganic encapsulation layer located in the display region and the binding region on the organic encapsulation layer, and removing a portion of the second inorganic encapsulation layer located in the binding region by etching the second inorganic encapsulation layer.

16. The method of manufacturing a display substrate according to claim 14, wherein forming the first inorganic encapsulation layer comprises:

forming at least one low-stress inorganic layer; and forming a first inorganic material layer on a side of the low-stress inorganic layer away from the base through Atomic Layer Deposition, wherein the first inorganic material layer is made of a material comprising a metal oxide.

17. The display panel according to claim 12, wherein the low-stress inorganic layer closest to the light extraction layer is made of a material comprising silicon oxynitride.

18. The display panel according to claim 12, wherein, the first inorganic encapsulation layer comprises at least two low-stress inorganic layers, and respective distances between the at least two low-stress inorganic layers and the light extraction layer are less than respective distances between other sub-film layers except the at least two low-stress inorganic layers in the first inorganic encapsulation layer and the light extraction layer.

19. The display panel according to claim 18, wherein the at least two low-stress inorganic layers comprise:

two silicon oxynitride film layers, and a silicon nitride film layer located between the two silicon oxynitride film layers.

20. The display panel according to claim 12, wherein, the plurality of sub-film layers comprise at least one low-stress inorganic layer, the first inorganic encapsulation layer further comprises a first inorganic material layer located on a side of the at least one low-stress inorganic layer away from the base, and the first inorganic material layer is made of a material comprising a metal oxide.

* * * * *